(12) United States Patent
Nakanishi et al.

(10) Patent No.: US 7,538,442 B2
(45) Date of Patent: May 26, 2009

(54) SEMICONDUCTOR CHIP AND SEMICONDUCTOR DEVICE

(75) Inventors: Hiroyuki Nakanishi, Soraku-gun (JP); Haruya Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 147 days.

(21) Appl. No.: 11/525,041

(22) Filed: Sep. 22, 2006

(65) Prior Publication Data

US 2007/0075424 A1    Apr. 5, 2007

(30) Foreign Application Priority Data

Sep. 30, 2005    (JP)    ............... 2005-289429

(51) Int. Cl.
*H01L 23/48* (2006.01)
(52) U.S. Cl. .................. 257/786; 257/773; 257/776; 257/780; 257/784; 257/E23.143
(58) Field of Classification Search ............. 257/737, 257/738, 664, 665, 734–786, E29.111–E29.165, 257/E23.01–E23.079, E23.141–E23.179; 438/613–617
See application file for complete search history.

(56) References Cited

U.S. PATENT DOCUMENTS

| | | | |
|---|---|---|---|
| 5,844,304 A | 12/1998 | Kata et al. | |
| 5,874,784 A | 2/1999 | Aoki et al. | |
| 5,898,223 A * | 4/1999 | Frye et al. | ............... 257/777 |
| 6,307,269 B1 | 10/2001 | Akiyama et al. | |
| 6,359,342 B1 * | 3/2002 | Yuan et al. | ............... 257/784 |
| 6,836,002 B2 * | 12/2004 | Chikawa et al. | ............. 257/666 |
| 6,838,767 B2 * | 1/2005 | Hirano et al. | ............... 257/737 |
| 6,946,747 B1 * | 9/2005 | Mori et al. | ................. 257/786 |

FOREIGN PATENT DOCUMENTS

| | | |
|---|---|---|
| JP | 8-222571 A | 8/1996 |
| JP | 3502056 | 12/2003 |
| KR | 1999-013673 A | 2/1999 |

* cited by examiner

*Primary Examiner*—Jasmine J Clark
(74) *Attorney, Agent, or Firm*—Nixon & Vanderhye P.C.

(57) ABSTRACT

In the peripheral part of a semiconductor chip, third electrode pads for wire bonding and plate wiring and first electrode pads dedicated to wire bonding are provided. On the other hand, second electrode pads dedicated to plate wiring are provided on an inner part away from the edge of the semiconductor chip. Further, the first and second electrode pads are connected via metal bypass layers, respectively. In the case of wire bonding, the first and third electrode pads are used and the third electrode pads are encapsulated with an insulating layer. Further, in the case of plate wiring, the second and third electrode pads are used and the first electrode pads are covered with an insulating layer. This realizes a semiconductor chip which has great versatility and which can be used in semiconductor packages of various types.

4 Claims, 7 Drawing Sheets

FIG. 3 (b)　　CROSS SECTION TAKEN ALONG B-B

FIG. 3 (c)　　CROSS SECTION TAKEN ALONG C-C

FIG. 6 (b)   CROSS SECTION TAKEN ALONG A-A

FIG. 7 (b)  CROSS SECTION TAKEN ALONG B-B

FIG. 7 (c)  CROSS SECTION TAKEN ALONG C-C

SEMICONDUCTOR CHIP AND SEMICONDUCTOR DEVICE

This Nonprovisional application claims priority under 35 U.S.C. § 119(a) on Patent Application No. 289429/2005 filed in Japan on Sep. 30, 2005, the entire contents of which are hereby incorporated by reference.

FIELD OF THE TECHNOLOGY

The present technology relates to (i) a semiconductor chip which is mounted on or built in an electronic device, and (ii) a semiconductor package (semiconductor device) containing the semiconductor chip.

BACKGROUND

In recent years, particularly in the field of small-sized portable electronic devices, there has been a movement toward downsizing, high functionality, and high-density mounting of electronic components, which are built in electronic devices. According to such a movement, there has been a demand for small-sized semiconductor packages which contain semiconductor chips.

One example of such small-sized semiconductor packages is a semiconductor package being equal in size to a chip (CSP: Chip Size Package), which is disclosed in Japanese Patent No. 3176542 (publication date: May 6, 1997), for example. In the CSP, generally, electrode pads are disposed in a peripheral part of a semiconductor chip, and electrically connected to an interpose substrate by wire bonding using metal wires (wire connections). Such an arrangement, in which the electrode pads are disposed in the peripheral part of the semiconductor chip, aims to (i) shorten the length of the wires, (ii) prevent deformation of the wire and shorting of the wire due to contact between the wire and the edge of the semiconductor chip, and (iii) facilitate disposing functional elements on the semiconductor chip.

FIG. 4(a) is a perspective view illustrating an exemplary structure of a CSP, and FIG. 4(b) is its cross-sectional view. As shown in the FIGS. 4(a) and 4(b), a CSP 60 includes: an interposer substrate 65; a semiconductor chip 62 mounted on the interposer substrate 65; wires 66 for connecting the interposer substrate 65 and the semiconductor chip 62; and a sealing resin 68 for sealing the semiconductor chip 62 and the wires 66.

The interposer substrate 65 includes an insulating base section 65a, a resist section 65b, and conductive sections 65c. The resist section 65b is provided on a surface of the insulating base section 65a for protecting the surface thereof. Further, each of the conductive sections 65c includes a through hole section and metal pattern sections. Each through hole section, provided in the insulating base section 65a, contains a conductive material, and the metal pattern sections are formed on both surfaces of the insulating base section 65a, respectively. A metal pattern section, formed on one surface of the insulating base section 65a, is connected to an electrode pad 64 on the semiconductor chip 62 using a wire 66. On the other hand, a metal pattern section formed on the other surface is connected to an external connection terminal 67.

One surface of the semiconductor chip 62 is fixed to the interposer substrate 65 via a die bonding sheet 69, and the other surface of the semiconductor chip 62 has electrode pads 64 disposed in its peripheral part. Each of the electrode pads 64 has a bonding connection with one leading end of a wire 66, and the other leading end of the wire 66 has a bonding connection with a conductive section 65c (metal pattern section) of the interposer substrate 65. Further, the other surface of the semiconductor chip 62 is sealed with an insulating layer 63, excluding regions where the electrode pads 64 are disposed. Further, the semiconductor chip 62, the insulating layer 63, the electrode pads 64, and the wires 66 are encapsulated with the sealing resin 68 and thus entirely protected.

With the above structure, in the CSP 60, signals on the semiconductor chip 62 are respectively supplied from the electrode pads 64 to the external connection terminals 67 via wires 66 and the conductive sections 65c of the interposer substrate 65.

Further, another example of the small-sized semiconductor package is a semiconductor package (wafer level CSP) disclosed in Japanese Patent No. 3502056 (publication date: Oct. 18, 2002). Such a semiconductor package is realized by directly forming external connection terminals on a surface of a semiconductor chip, so that the semiconductor chip itself serves as a semiconductor package (wafer level CSP). In the wafer level CSP, rewiring is performed by plating the surface of the semiconductor chip. This provides internal connections between electrode pads of the semiconductor chip and the external connection terminals.

FIG. 5(a) is a perspective view illustrating an exemplary structure of a wafer level CSP, and FIG. 5(b) is its cross-sectional view. In a wafer level CSP 80 shown in FIGS. 5(a) and 5(b), on one surface of a semiconductor chip 82, electrode pads 84 are disposed in its peripheral part, while the rest part of the surface is covered with an insulating layer 83, excluding the regions where the electrode pads 84 are disposed. Further, one end of each conductive section 86, formed by plating, is connected to an electrode pad 84, while the other end of the conductive section 86 is connected to an external connection terminal 87 formed over the insulating layer 83. Further, the surface is covered with an insulating layer 88 and thus protected, excluding regions where external connection terminals 87 are attached (i.e., regions where the insulating layer 83, the electrode pads 84, and the conductive sections 86 are provided).

With the above structure, in the wafer level CSP 80, signals on the semiconductor chip 82 are supplied from the electrode pads 84 to the external connection terminals 87 via the conductive sections 86, respectively.

However, with such conventional wafer level CSP techniques, disposing external connection terminals in the peripheral part as well as in the vicinity of the center part of the semiconductor chip causes a problem of being unable to draw wires from the electrode pads to the external connection terminals in the vicinity of the center part.

When a large number of external connection terminals are provided, the external connection terminals need to be disposed not only in the vicinity of the center part but also in the peripheral part of a semiconductor chip. In a semiconductor chip provided in a conventional wafer level CSP, however, electrode pads are provided in the peripheral part of the semiconductor chip. Thus, disposing external connection terminals in the peripheral part of the semiconductor chip causes the electrode pads to be covered. As a result, wires cannot be drawn from the covered electrode pads.

When external connection terminals need to be disposed also in the peripheral part of a semiconductor chip, it has been therefore necessary to design another semiconductor chip, dedicated to a wafer level CSP, in which electrode pads are disposed not only on a peripheral part but also in an inner part of the semiconductor chip (i.e., an inner part away from the edge of the semiconductor chip). In this case, it is impossible to share a semiconductor package used in a conventional CSP package. This gives rise to a problem of increasing cost and time for development, for example when employing semiconductor packages of a same type for both a wafer level CSP and a CSP.

SUMMARY

The example embodiment presented herein is made in view of the foregoing problems, and a feature of the example embodiment is to provide (i) a semiconductor chip which can be used in semiconductor packages of various types and which has great versatility, and (ii) a semiconductor package including the semiconductor chip.

To solve the foregoing problems, a semiconductor chip of the example embodiment includes: a semiconductor element; and a plurality of electrode sections, to or from each of which a signal is inputted or outputted from or to the semiconductor element, respectively, the semiconductor element and the electrode sections being provided on a main surface of the semiconductor chip, the electrode sections including: at least one first electrode section disposed in a peripheral part of the main surface; and at least one second electrode section disposed on an inner part of the first electrode section of the main surface, and the first and second electrode sections being electrically connected.

According to the arrangement, it is possible to input or output the same signal to or from either of the first electrode section and the second electrode section, which are electrically connected to each other. Thus, the semiconductor chip can be applied to semiconductor packages of various types including: (i) semiconductor packages such as conventional CSPs, in which wire bonding is performed; (ii) wafer level CSPs; and (iii) the like. This eliminates the need to prepare semiconductor chips, which are significantly different in design specification, for respective semiconductor packages being different regarding their structures and manufacturing methods, thereby reducing production cost. Further, it also becomes possible to provide semiconductor packages easily within a short time, which are different in package design while having the same functions.

Further, a semiconductor device according to the example embodiment presented herein includes the semiconductor chip, the main surface of the semiconductor chip having thereon a plurality of external connection terminals via which the electrode sections are connected to an external device, and at least one of the external connection terminals being connected to the at least one second electrode section.

According to the arrangement, since there is no need to design a dedicated semiconductor chip separately, production cost can be reduced. Further, even when the external connection terminal cannot be easily connected to the first electrode disposed in the peripheral part of the semiconductor chip, it is possible to connect the external connection terminal to the second electrode section, which is electrically connected to the first electrode section. There may be a case, for example, where a large number of external connection terminals need to be provided and thus disposed up to the peripheral part of the semiconductor chip, and where external connection terminals in the peripheral part cover the first electrode section so that a wire cannot be drawn from part of the first electrode section. Even in such a case, it is possible to draw a wire from the second electrode section, which is electrically connected to the part of the first electrode section.

In this case, it is preferable that the first electrode section be covered with an insulating layer. This prevents the first electrode section from being electrically conductive to a wire, an external connection terminal, or the like, via which a signal other than a signal from the first electrode section is transmitted.

Further, the at least one of the external connection terminals may be disposed in a region which overlaps the at least one first electrode section, when viewed from the direction normal to the main surface of the semiconductor chip. This allows the external connection terminals to be disposed up to the peripheral part of the semiconductor chip, thereby (i) increasing the number of inputted and outputted signals per unit area of the semiconductor chip or (ii) downsizing the semiconductor.

To solve the foregoing problems, another semiconductor device of the example embodiment includes a semiconductor chip, the semiconductor chip further including a stacked substrate on which the semiconductor chip is stacked, the stacked substrate including: a plurality of external connection terminals; and a plurality of conductive sections being connected to the external connecting terminals, respectively, and at least one of the conductive sections being connected to the at least one first electrode section via at least one wire.

According to the arrangement, since there is no need to design a dedicated semiconductor chip separately, production cost can be reduced. Further, from among the first and second electrode sections which are electrically connected to each other, the first electrode section disposed in the peripheral part of the semiconductor chip can be used for performing wire bonding. This enables the wire to have shorter length, compared to a case where the second electrode section, disposed on the inner part of the semiconductor chip, is used for performing wire connections. This further prevents (i) deformation of the wire and (ii) shorting of the wire due to contact between the wire and the edge of the semiconductor chip. Further, it also becomes possible to enlarge areas where the functional elements are formed, so that functional elements can be easily disposed on the semiconductor chip.

Additional features, and strengths of the example embodiment presented herein will be made clear by the description below. Further, the advantages of the example embodiment will be evident from the following explanation in reference to the drawings.

DESCRIPTION OF THE EMBODIMENTS

Figure 2:
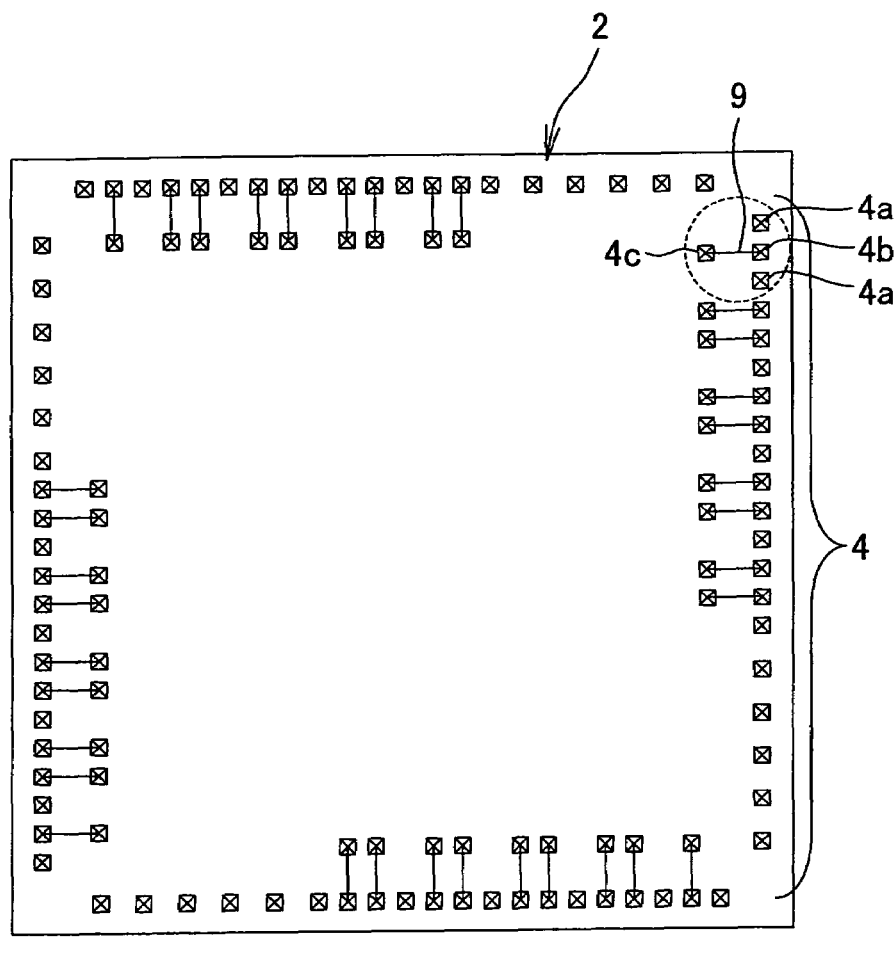
FIG. 2 is a plan view illustrating a schematic structure of the semiconductor chip according to one embodiment.
Figure 2:
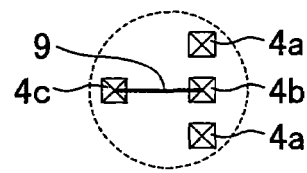

The following will describe one embodiment. FIG. 2 is a plan view illustrating a schematic structure of a main surface of a semiconductor chip 2 according to the present embodiment (surface on which a semiconductor element (semiconductor integrated circuit) is provided). In FIG. 2, an arrangement of electrode pads (electrode sections) 4 is mainly illustrated.

The semiconductor chip 2 of the present embodiment has external connection terminals 7 mounted thereon. The semiconductor chip 2 can be applied to (i) a wafer level CSP in which the semiconductor chip 2 itself serves as a semiconductor package, and (ii) a semiconductor package (CSP etc.) in which the semiconductor chip 2 is electrically connected to a stacked substrate by wire bonding.

As shown in FIG. 2, the semiconductor chip 2 has (i) a large number of electrode pads 4 (4a and 4b) disposed along the peripheral part of its main surface, and (ii) a large number of electrode pads 4 (4c) disposed on an inner part of the main surface, i.e., an inner part away from the edge of the main surface). Further, the electrode pads (first electrode sections) 4b and the electrode pads (second electrode sections) 4c are connected to each other via metal bypass layers (wires) 9, respectively.

With the above structure, the electrode pads (third electrode sections) 4a can be used for both plate wiring and wire bonding. Further, the electrode pads 4b are dedicated to wire bonding, and the electrode pads 4c are dedicated to plate wiring.

In the present embodiment, the semiconductor chip 2 has a size of longitudinal 4.5 mm×lateral 0.3 mm×thickness 0.3 mm. Further, each of the electrode pads 4 has a size of longitudinal 0.1 mm×lateral 0.1 mm. However, the shapes and sizes of the semiconductor chip 2 and the electrode pads 4 are not limited to the examples.

Further, materials of components provided in the semiconductor chip 2 are not particularly limited, and conventionally known materials may be used. In the present embodiment, surfaces of the electrode pads 4 are made of aluminum (Al).

Figure 1:
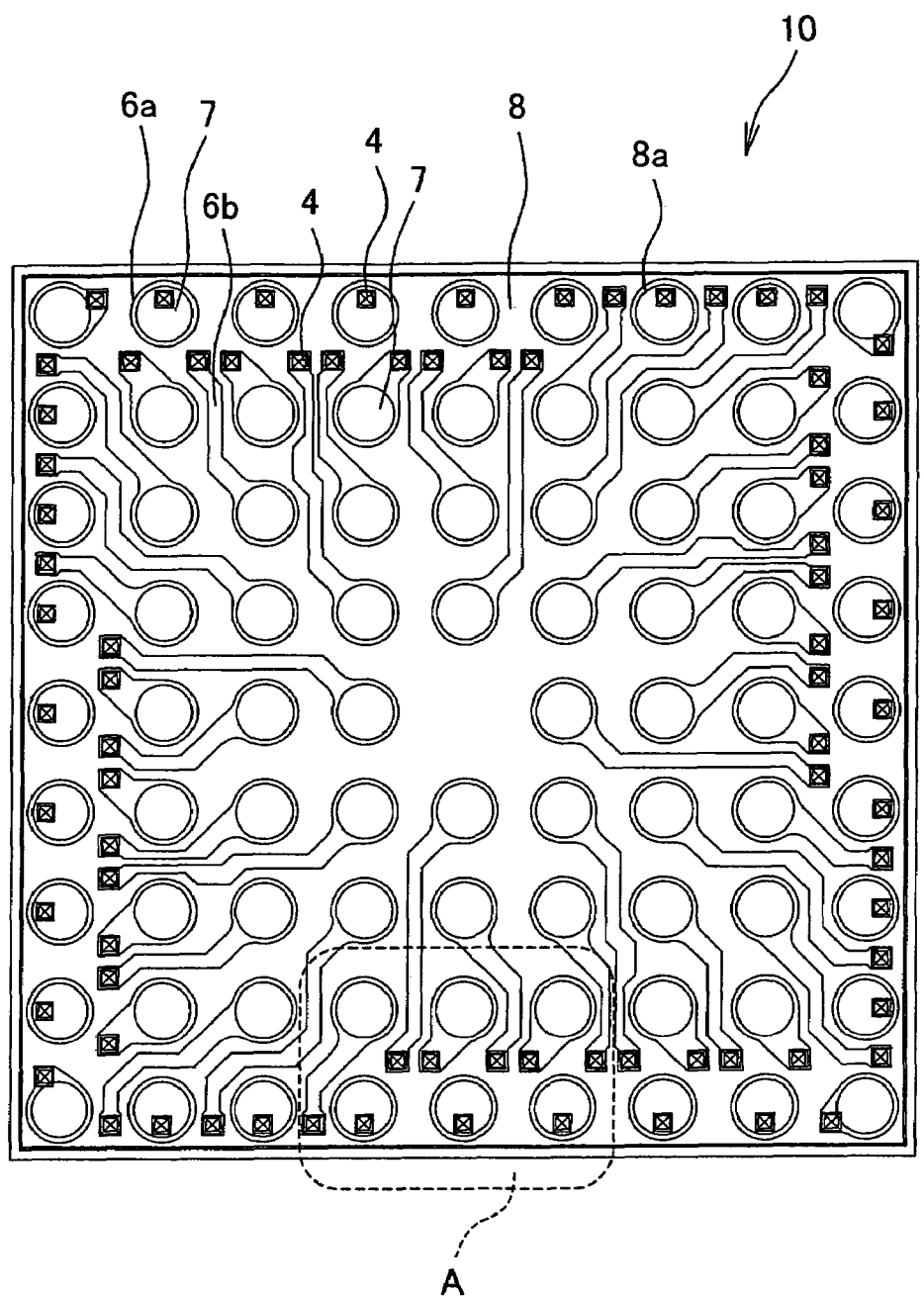
FIG. 1 is a perspective plan view illustrating an exemplary structure of a semiconductor package according to one embodiment.

The following will describe a case where the external connection terminals 7 are formed on the semiconductor chip 2, i.e., a case where the semiconductor chip 2 constitutes a wafer level CSP (semiconductor package) 10. FIG. 1 is a perspective plan view illustrating a schematic structure of the semiconductor package 10 including the semiconductor chip 2 of the present embodiment.

As shown in FIG. 1, in the semiconductor package (semiconductor device) 10, a large number of external connection terminals 7 are disposed along the peripheral part (the edge) of the main surface of the semiconductor chip 2. Further, a large number of external connection terminals 7 are disposed also on the inner part of the edge of the main surface (i.e., inner part when viewed from a direction normal to the main surface), up to the vicinity of the center part of the semiconductor chip 2. As used herein, the main surface of the semiconductor chip 2 is a surface on which a semiconductor element (semiconductor integrated circuit: not shown) is provided. Specifically, the main surface of the semiconductor chip 2 is divided into a matrix of 9 rows×9 columns, i.e., 81 segments, 80 of which have the external connection terminals 7 disposed thereon, excluding a segment located in the center part of the matrix (a segment positioned at fifth row and fifth column).

The electrode pads 4 and the external connection terminals 7 are connected via the conductive sections (plated metal sections, wires) 6a. Further, some of the external connection terminals 7 disposed in the peripheral part (outer peripheral part of the matrix) are directly connected to electrode pads 4a, which are provided below the external connection terminals 7 (i.e., the external connection terminals 7 overlap the electrode pads 4a when viewed from the direction normal to the surface of the substrate). The other external connection terminals 7 are connected to the other electrode pads 4a and the electrode pads 4c via the conductive sections 6a and 6b.

Figure 3:
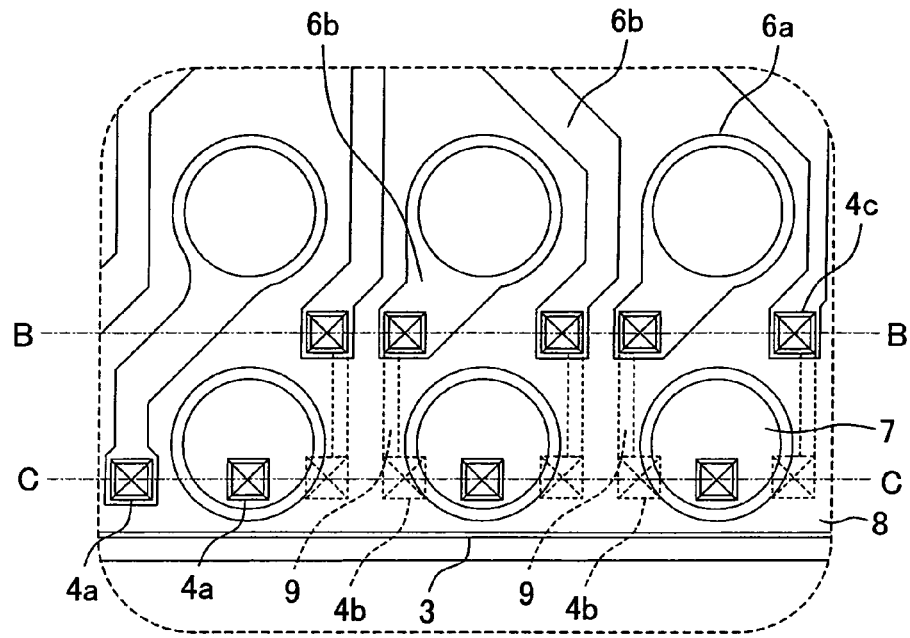
FIG. 3(a) is a perspective plan view showing an enlarged A section of FIG. 1.
FIG. 3(b) is a cross-sectional view taken along line B-B of FIG. 3(a)
FIG. 3(c) is a cross-sectional view taken along line C-C of FIG. 3(a).
Figure 3:
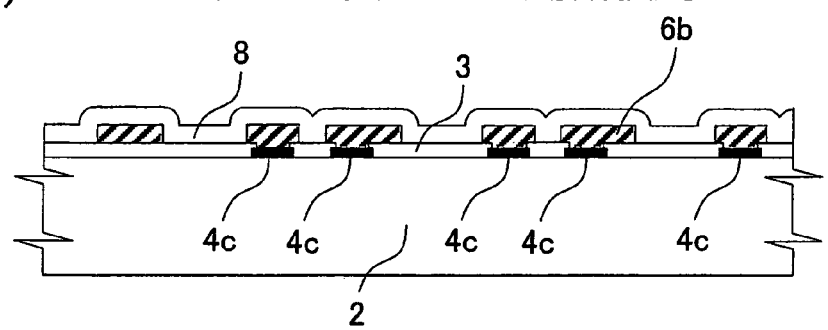
Figure 3:
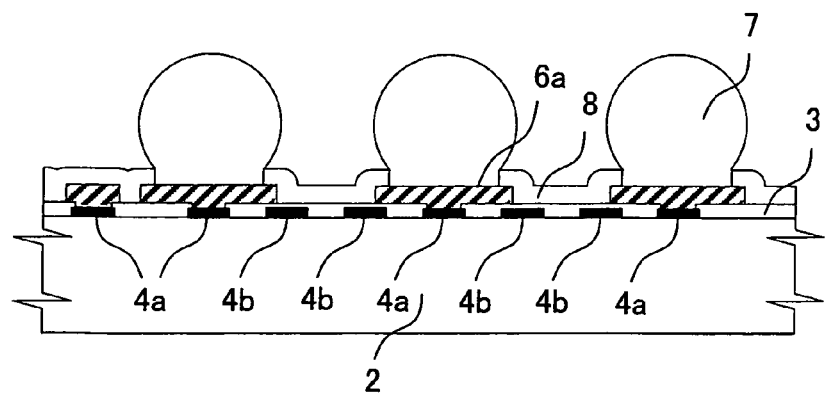
Figure 4:
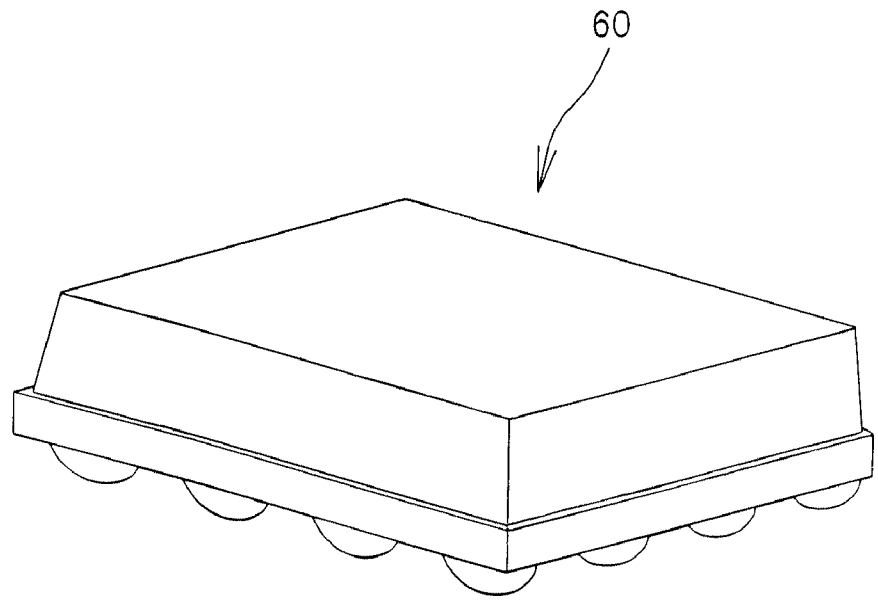
FIG. 4(a) is a perspective view illustrating an exemplary structure of a conventional CSP.
FIG. 4(b) is its cross-sectional view.
Figure 4:
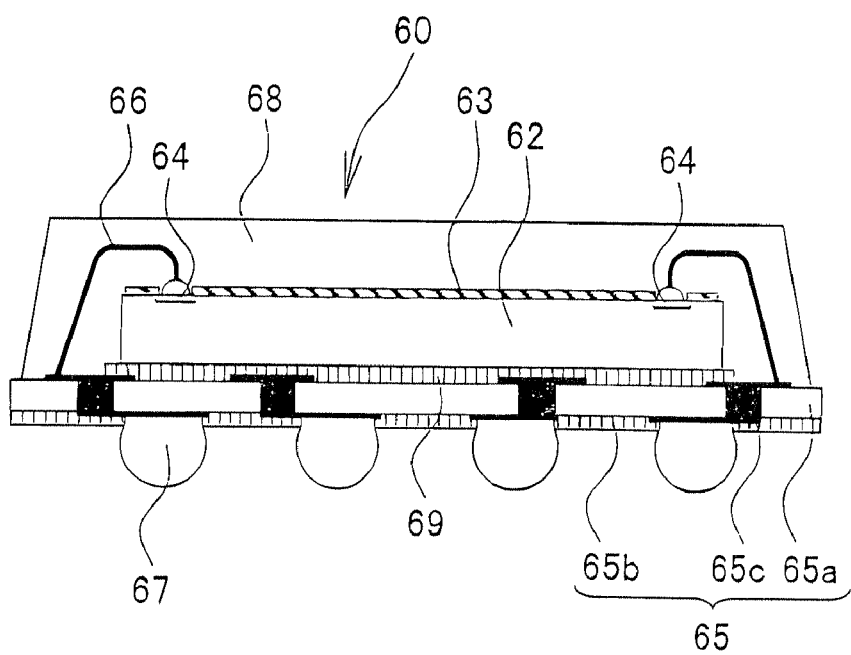
Figure 5:
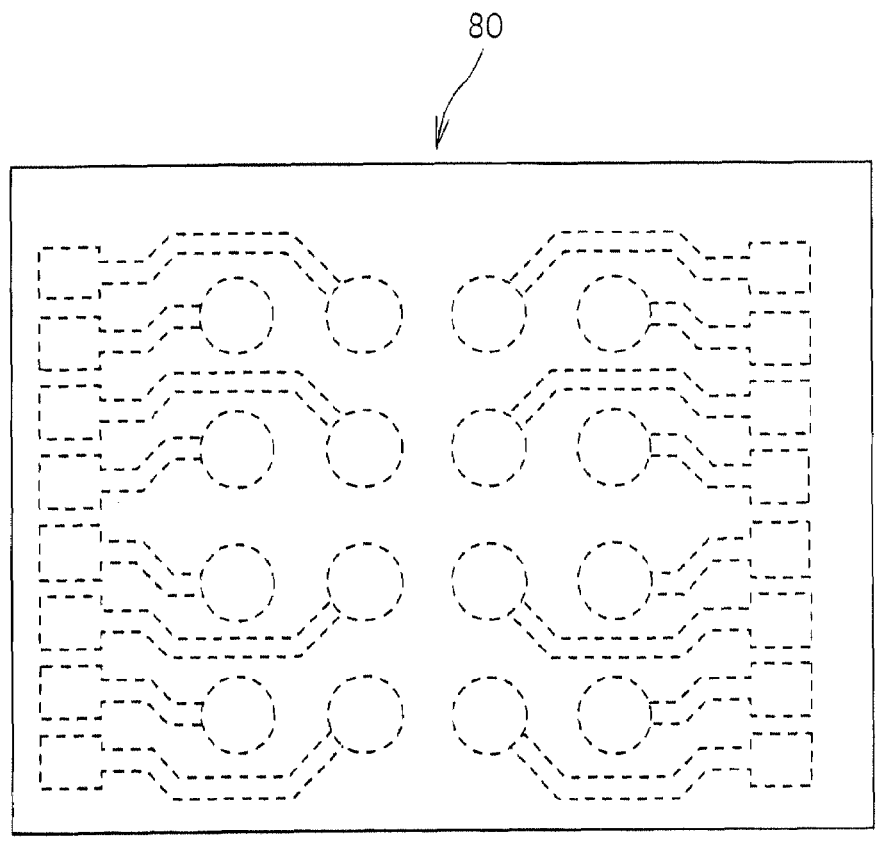
FIG. 5(a) is a perspective view illustrating an exemplary structure of a conventional wafer level CSP.
FIG. 5(b) is its cross-sectional view.
Figure 5:
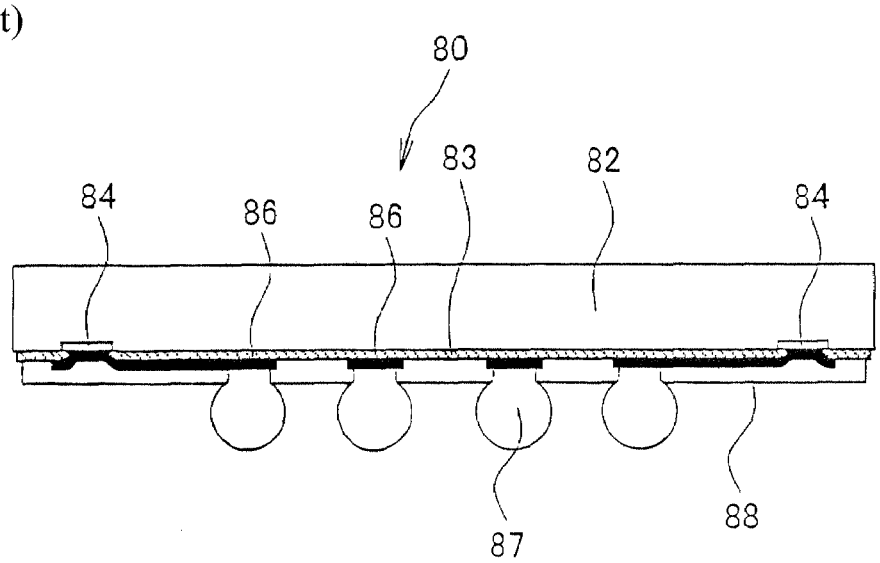

FIG. 3(a) is a perspective plan view illustrating an enlarged A section of FIG. 1. FIG. 3(b) is a cross-sectional view taken along line B-B of FIG. 3(a), and FIG. 3(c) is a cross-sectional view taken along line C-C of FIG. 3(a). Note that, in FIG. 3(a), solid lines and dotted lines are used for convenience of explanation, however, these lines do not necessarily indicate visible and invisible portions.

As shown in FIG. 3(b) illustrating the cross-sectional view taken along the line B-B, the electrode pads 4c are provided on a surface of the semiconductor chip 2, and the surface is covered with an insulating layer 3. The insulating layer 3 is partially removed, so that part of the electrode pads 4c is exposed. This causes the contact electrode pads 4c thus exposed to come in contact with conductive sections 6 (6b). Further, the insulating layer 3 and the conductive sections 6 (6b) are covered with an insulating layer 8.

As shown in FIG. 3(c) illustrating the cross-sectional view taken along the line C-C, electrode pads 4a and 4b are provided on the surface of the semiconductor chip 2, and the surface is covered with the insulating layer 3. The insulating layer 3 is partially removed, so that part of the electrode pads 4a is exposed. This causes the contact electrode pads 4a thus exposed to come in contact with conductive sections 6 (6a and 6b). On the conductive sections 6a, external connection terminals 7 are provided and connected to the conductive sections 6a, respectively. Further, the insulating layer 8 is provided so as to cover the surface, excluding regions where the external connection terminals 7 are attached.

As such, the electrode pads 4a and the electrode pads 4c are connected to the external connection terminals 7 via the conductive sections 6 (only 6a, or 6a and 6b), while the electrode pads 4b are covered with the insulating layer 3. With the above structure, the electrode pads 4b are insulated by the insulating layer 3 and prevented from contacting the conductive sections 6a, though the electrode pads 4b are provided so as to overlap the insulating section 6a when the semiconductor chip 2 is viewed from above.

In the semiconductor package 10, the insulating layers 3 and 8 are constituted by films made of silicon dioxide ($SiO_2$). Alternatively, a film made of, for example, silicon nitride (SiN) may be used. Further, on the insulating films (insulating layers), a polymer material such as polyimide, polybenzoxal (PBO) or benzocyclobutene (BCB) may be formed with a thickness ranging from 3 µm to 10 µm.

Further, in the semiconductor package 10, each of the conductive sections (plated wires) 6 (6a and 6b) includes: a seed metal made of titanium (Ti) having a thickness of 0.1 µm formed on an electrode pad 4; a copper (Cu) film having a thickness of 0.1 µm formed on the seed metal by sputtering; and copper having a thickness of 10 µm formed on the copper film by sputtering. With the seed metal thus provided, it is possible to suppress interdiffusion of aluminum (Al) and copper (Cu) of the electrode pads 4. As the seed metal, for example, titanium tungsten (TiW) or chrome (Cr) may also be used to obtain the similar effects.

Further, in the semiconductor package 10, the external connection terminals 7 are realized by a Tin(Sn)-based solder alloy.

In the semiconductor package 10, the size and number of each component are specified as follows:

Diameter of an external connection terminal 7: 0.31 mm
Height of an external connection terminal: 0.22 mm
Pitch of an external connection terminal: 0.5 mm
The number of external connection terminals 7: 80 ((the number of segments constituting a matrix of 9×9)−1 (a segment positioned in the center))
Size of an opening provided in an insulating layer 3 (on electrode pads 4a and 4c): 0.08 mm×0.08 mm
Diameter of a conductive section 6a (where an external connection terminal 7 is attached): 0.33 mm
Size of an opening provided in an insulating layer 8 (on a conductive section 6a): 0.28 mm It should be noted that the size, number, and material of each component do not limit the scope of the invention, and may be suitably altered.

Figure 6:
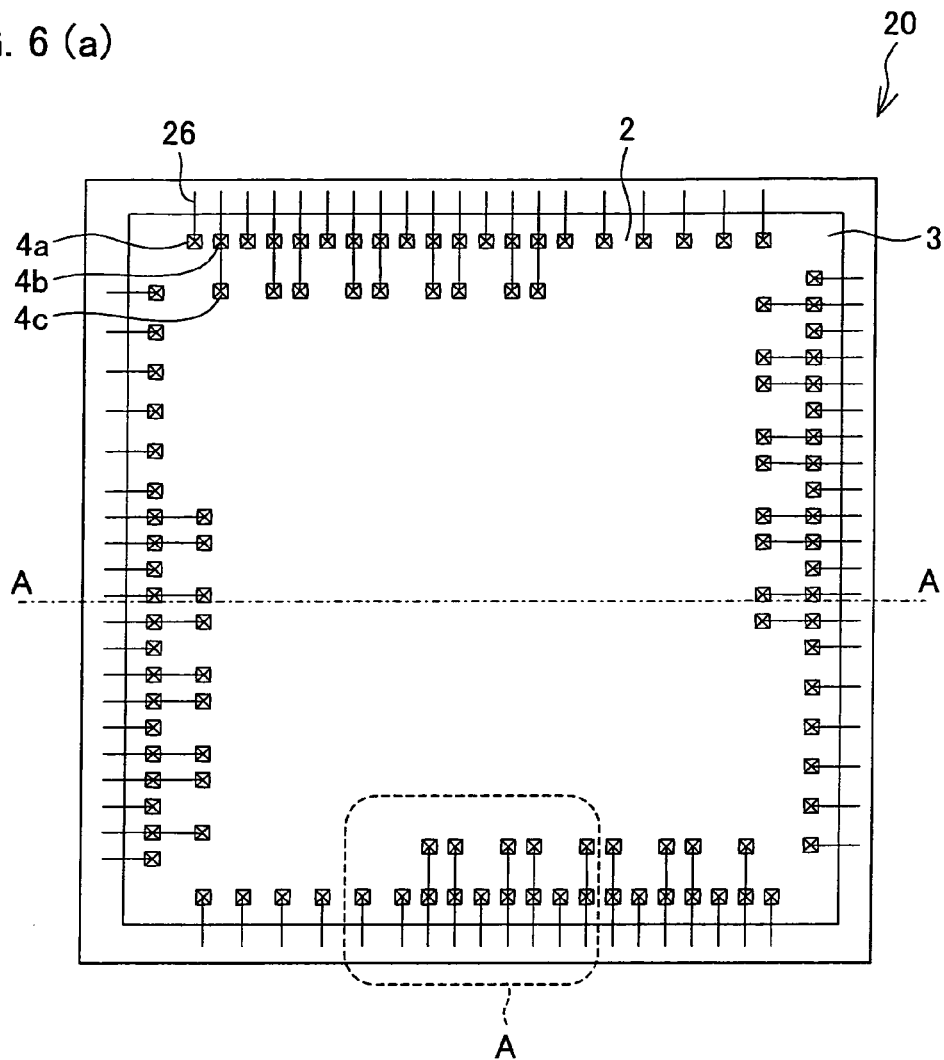
FIG. 6(a) is a plan view schematically illustrating an exemplary structure of a semiconductor package according to one embodiment of the present invention.
FIG. 6(b) is a cross-sectional view of the semiconductor package shown in FIG. 6(a).
Figure 6:
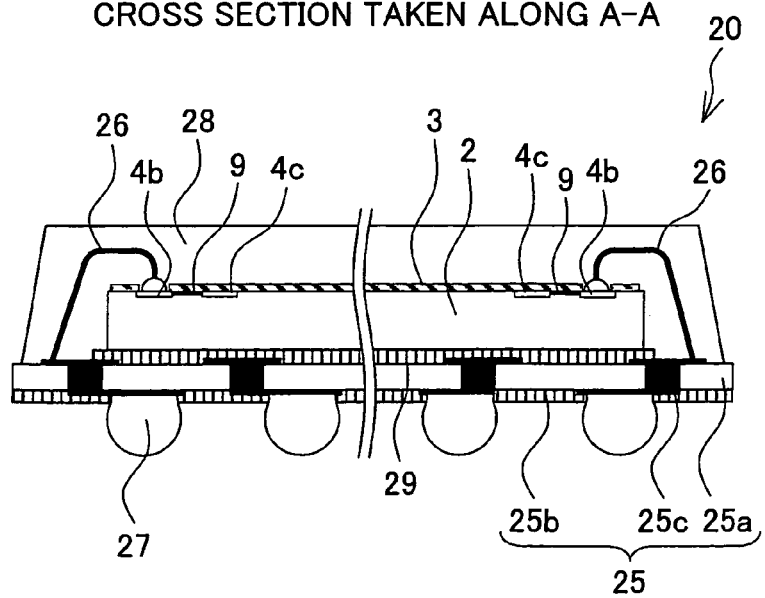

The following will describe a case where the semiconductor chip 2 is electrically connected to a stacked substrate by wire bonding. FIG. 6(a) is a plan view schematically illustrating a structure of a semiconductor package (CSP) 20 when viewed from above, in which the semiconductor chip 2 is connected to an interposer substrate (stacked substrate) 25 by wire bonding. FIG. 6(b) is its cross-sectional view.

As shown in the FIGS. 6(a) and 6(b), a CSP (semiconductor device) 20 includes: an interposer substrate 25; a semiconductor chip 2 mounted on the interposer substrate 25; wires 26 for connecting the interposer substrate 25 and the semiconductor chip 2; and a sealing resin 28 for sealing the semiconductor chip 2 and the wires 26.

The interposer substrate 25 includes an insulating base section 25a, a resist section 25b, and conductive sections 25c. The resist section 25b is provided on a surface of the insulating base section 25a for protecting the surface thereof. Further, each of the conductive sections 65c includes a through hole section and metal pattern sections. Each through hole section, provided in the insulating base section 25a, contains a conductive material, and the metal pattern sections are respectively formed on both surfaces of the insulating base section 25a. A metal pattern section, formed on one surface of the insulating base section 25a, is connected to an electrode pad 4 on the semiconductor chip 2 using a wire 26. On the other hand, a metal pattern section formed on the other surface is connected to an external connection terminal 27.

One surface of the semiconductor chip 2 (bottom surface of the semiconductor chip 2 (surface on which no electrode pad 4 is disposed)) is fixed to the interposer substrate 25 via a die bonding sheet 29. Further, the semiconductor chip 2, the insulating layer 3, the electrode pads 4, and the wires 26 are encapsulated with the sealing resin 28 and thus entirely protected.

Figure 7:
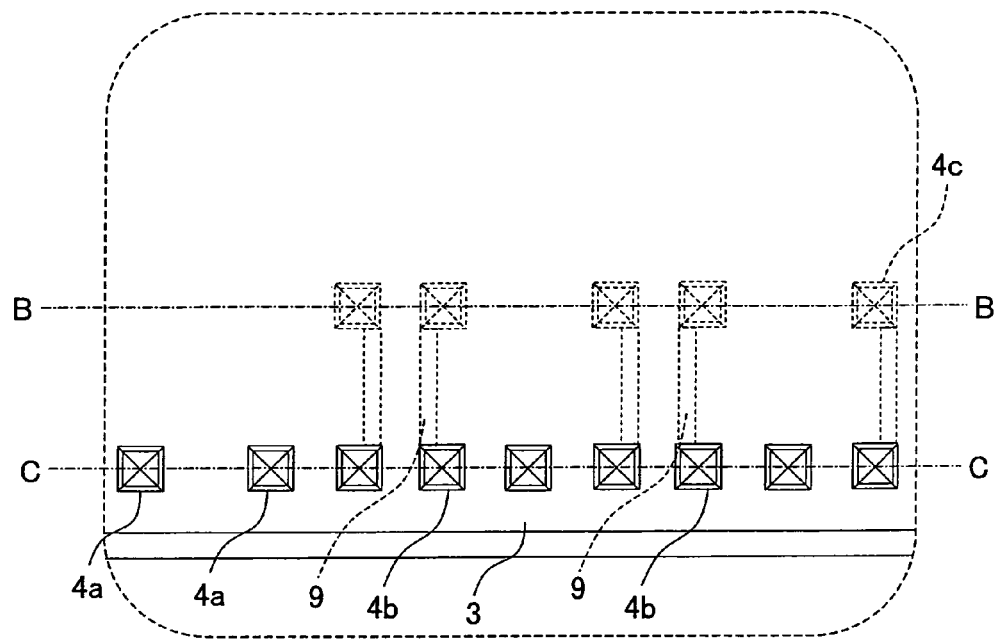
FIG. 7(a) is a perspective plan view illustrating an enlarged A section of FIG. 6(a)
FIG. 7(b) is a cross-sectional view taken along line B-B of FIG. 7(a)
FIG. 7(c) is a cross-sectional view taken along line C-C of FIG. 7(a).
Figure 7:
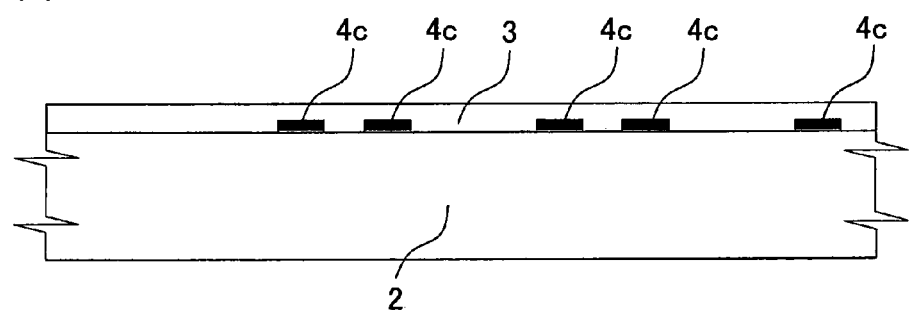
Figure 7:
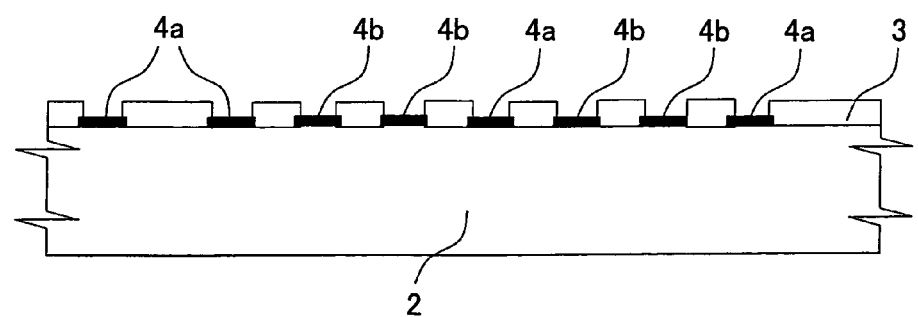

As shown in FIGS. 7(a) through 7(c), a top surface of the semiconductor chip 2 is covered with the insulating layer 3, excluding regions where the electrode pads 4 (4a and 4b) and the wires 26 are connected.

FIG. 7(a) is a perspective plan view illustrating an enlarged A section of FIG. 6(a). FIG. 7(b) is a cross-sectional view taken along line B-B of FIG. 7(a), and FIG. 7(c) is a cross-sectional view taken along line C-C of FIG. 7(a). Note that, in FIGS. 7(a) through 7(c), the wires 26 and the sealing resin 28 are omitted for clarity.

As such, in the semiconductor package 20, since the electrode pads 4c are not used, the electrode pads 4c are covered with the insulating layer 3. Even if the electrode pads 4c are exposed, the exposed portions are sealed with a sealing resin 28, causing no problem. That is, the insulating layer 3 is not necessarily required.

With the above structure, in the semiconductor package 20, signals on the semiconductor chip 2 (input or output signals of the semiconductor chip 2) are supplied from the electrode pads 4a or 4b to the external connection terminals 27 via wires 26 and the conductive sections 25c of the interposer substrate 25, respectively.

As described above, in the semiconductor chip of the present embodiment, electrode pads 4b are disposed in its peripheral part and electrode pads 4c are disposed on the inner part away from the edge of the semiconductor chip (i.e., inner part when viewed from a direction normal to the main surface of the semiconductor chip 2). Further, the electrode pads 4b and the electrode pads 4c are connected to each other via metal bypass layers (wires) 9, respectively.

This enables the same signal to be drawn (inputted or outputted) to or from either of an electrode pad 4b and an electrode pad 4c, which are connected to each other. That is, the electrode pads 4b and the electrode pads 4c are not required to have respective logic circuits, so that it becomes easy to select either of the electrode pads.

Thus, the semiconductor chip 2 can be applied to semiconductor packages of various types. That is, the semiconductor chip 2 can be applied to a semiconductor package, such as a conventional CSP in which wire bonding is performed. Further, the semiconductor chip 2 can be applied to a wafer level CSP, by sealing bonding pads (electrode pads 4b) dedicated to wire bonding with an insulating layer so as to electrically insulate the bonding pads from plated metal sections (conductive sections 6) formed on other pads (electrode pads 4a) in the vicinity of the bonding pads.

With the use of the semiconductor chip 2 having such great versatility, it becomes possible to eliminate the need to prepare semiconductor chips, which are significantly different in design specification, for respective semiconductor packages being different regarding their structures and manufacturing methods. Further, it also becomes possible to provide semiconductor packages easily within a short time, which are different in package design while having the same functions.

Further, when used as a wafer level CSP, the semiconductor chip 2 may be arranged such that the external connection terminals 7 are disposed not only in the vicinity of the center part but also in the peripheral part of the semiconductor chip 2, so that the external connection terminals 7 connected to the electrode pads 4a cover the electrode pads 4b. Even in such a case, signals inputted or outputted to or from the electrode pads 4b can be obtained via the respective electrode pads 4c, which are connected to the electrode pads 4b via the metal bypass layers 9, respectively. This enables the semiconductor chip 2 to be preferably used in a wafer level CSP, in which a large number of signals are inputted and outputted per unit area. In other words, by using the semiconductor chip 2 to constitute a wafer level CSP, the wafer level CSP is realized in smaller size than those of commonly used wafer level CSPs.

Further, when the semiconductor chip 2 is connected to an interposer substrate by wire bonding, signals inputted or outputted to or from the electrode pads 4c can be obtained from the respective electrode pads 4b, which are connected to the electrode pads 4c via the metal bypass layers 9, respectively. This enables the wires to have shorter length, compared to a case where the signals are obtained from the electrode pads 4c. Further, it becomes possible to prevent (i) deformation of the wires and (ii) shorting of the wires due to contact between the wires and the edges of the semiconductor chip 2. Further, it also becomes possible to enlarge areas where the functional elements are formed, so that functional elements can be easily disposed on the semiconductor chip 2.

In the semiconductor chip 2, (i) the electrode pads 4b disposed in the peripheral part and (ii) the electrode pads 4c disposed on the inner part away from the edge of the semiconductor chip 2 are connected via the metal bypass layers 9. However, this is not the only case. For example, electrode pads may be provided further inside the electrode pads 4c and connected to the electrode pads 4b via metal bypass layers.

Further, in the present embodiment, the foregoing described a case where the semiconductor chip 2 is electrically connected to a stacked substrate by wire bonding. The foregoing described specifically a case of using CPS in which the semiconductor chip 2 is fixed to one surface of the interposer substrate 25, and external connection terminals are disposed on the other surface of the interposer substrate 25, specifically in a region corresponding to the semiconductor chip 2. However, this is not the only case. For example, external connection terminals may be disposed on a single surface where the semiconductor chip 2 is disposed. Alternatively, external connection terminals may be disposed on the other surface of the stacked substrate, specifically in a region not corresponding to the semiconductor chip 2. Further, the semiconductor chip 2 may be disposed on the both surfaces of the stacked substrate.

As described above, a semiconductor chip according to the example embodiment includes: a semiconductor element; and a plurality of electrode sections, to or from each of which a signal is inputted or outputted from or to the semiconductor element, respectively, the semiconductor element and the electrode sections being provided on a main surface of the semiconductor chip, the electrode sections including: at least one first electrode section disposed in a peripheral part of the main surface; and at least one second electrode section disposed on an inner part of the first electrode section of the main surface, the first and second electrode sections being electrically connected.

According to the arrangement, it is possible to input or output the same signal to or from either of the first electrode section and the second electrode section, which are electrically connected to each other. Thus, the semiconductor chip can be applied to semiconductor packages of various types including: (i) semiconductor packages such as conventional CSPs, in which wire bonding is performed; (ii) wafer level CSPs; and (iii) the like. This eliminates the need to prepare semiconductor chips, which are significantly different in design specification, for respective semiconductor packages being different regarding their structures and manufacturing methods, thereby reducing production cost. Further, it also becomes possible to provide semiconductor packages easily within a short time, which are different in package design while having the same functions.

Further, a semiconductor device according to the example embodiment includes the semiconductor chip, the main surface of the semiconductor chip having thereon a plurality of external connection terminals via which the electrode sections are connected to an external device, and at least one of the external connection terminals being connected to the at least one second electrode section.

According to the arrangement, since there is no need to design a dedicated semiconductor chip separately, production cost can be reduced. Further, even when the external connection terminal cannot be easily connected to the first electrode disposed in the peripheral part of the semiconductor chip, it is possible to connect the external connection terminal to the second electrode section, which is electrically connected to the first electrode section. There may be a case, for example, where a large number of external connection terminals need to be provided and thus disposed up to the peripheral part of the semiconductor chip, and where external connection terminals in the peripheral part cover the first electrode section so that a wire cannot be drawn from part of the first electrode section. Even in such a case, it is possible to draw a wire from the second electrode section, which is electrically connected to the part of the first electrode section.

In this case, it is preferable that the first electrode section be covered with an insulating layer. This prevents the first electrode section from being electrically conductive to a wire, an external connection terminal, or the like, via which a signal other than a signal from the first electrode section is transmitted.

Further, the at least one of the external connection terminals may be disposed in a region which overlaps the at least one first electrode section, when viewed from the direction normal to the main surface of the semiconductor chip. This allows the external connection terminals to be disposed up to the peripheral part of the semiconductor chip, thereby (i) increasing the number of inputted and outputted signals per unit area of the semiconductor chip and/or (ii) downsizing the semiconductor.

Further, another semiconductor device according to the example embodiment includes the semiconductor chip, and a stacked substrate on which the semiconductor chip is stacked, the stacked substrate including: a plurality of external connection terminals; and a plurality of conductive sections being connected to the external connecting terminals, respectively, and at least one of the conductive sections being connected to the at least one first electrode section via at least one wire.

According to the arrangement, since there is no need to design a dedicated semiconductor chip separately, production cost can be reduced. Further, from among the first and second electrode sections which are electrically connected to each other, the first electrode section disposed in the peripheral part of the semiconductor chip can be used for performing wire bonding. This enables the wire to have shorter length, compared to a case where the second electrode section, disposed on the inner part of the semiconductor chip, is used for performing wire connections. This further prevents (i) deformation of the wire and (ii) shorting of the wire due to contact between the wire and the edge of the semiconductor chip. Further, it also becomes possible to enlarge areas where the functional elements are formed, so that functional elements can be easily disposed on the semiconductor chip.

Further, the semiconductor chip may be arranged such that the semiconductor chip is fixed to one surface of the stacked substrate, at least one of the external connection terminals is disposed in a region of another surface of the stacked substrate, the region overlapping the semiconductor chip when viewed from a direction normal to the surface of the substrate, and the at least one of the conductive sections, connected to the at least one external connection terminals disposed in the region, connects the at least one external connection terminals and the at least one wire via one of through holes provided in the stacked substrate.

According to the arrangement, the semiconductor chip and the external connection terminals are formed in the region where the semiconductor chip and the external connection terminals overlap each other when viewed from the direction normal to the surface of the stacked substrate. This realizes downsizing of the semiconductor device in a direction parallel to the surface of the substrate.

Further, it is preferable that the semiconductor chip, the at least one wire, and the at least one conductive section be sealed with an insulating material.

This enables the semiconductor chip to be protected from the external environment. It also becomes possible to prevent the second electrode section from being electrically conductive to another component.

The embodiments and concrete examples of implementation discussed in the foregoing detailed explanation serve solely to illustrate the technical details, which should not be narrowly interpreted within the limits of such embodiments and concrete examples, but rather may be applied in many variations within the spirit of the example embodiment presented herein, provided such variations do not exceed the scope of the patent claims set forth below.

What is claimed is:

1. A semiconductor device, comprising a semiconductor chip,
   said semiconductor chip, including:
   a semiconductor element; and
   a plurality of electrode sections, to or from each of which a signal is inputted or outputted from or to the semiconductor element, respectively,
   the semiconductor element and the electrode sections being provided on a main surface of the semiconductor chip,
   the electrode sections including:
   at least one first electrode section and at least one third electrode section disposed in a peripheral part of the main surface; and
   at least one second electrode section disposed on an inner part of the first and third electrode sections of the main surface,
   the first and second electrode sections being electrically connected,
   the third and second electrode sections not being electrically connected,
   the main surface of the semiconductor chip having thereon a plurality of external connection terminals via which the electrode sections are connected to an external device,
   said plurality of external connection terminals being connected to the second or third electrode section,
   the first electrode section being covered with an insulating layer, and
   at least one of the external connection terminals being disposed in a region which overlaps the first electrode section, when viewed from a direction normal to the main surface of the semiconductor chip.

2. A semiconductor device, comprising a semiconductor chip, said semiconductor chip, including:
   a semiconductor element; and
   a plurality of electrode sections, to or from each of which a signal is inputted or outputted from or to the semiconductor element, respectively,
   the semiconductor element and the electrode sections being provided on a main surface of the semiconductor chip,
   the electrode sections including:
   at least one first electrode section disposed in a peripheral part of the main surface; and
   at least one second electrode section disposed on an inner part of the first electrode section of the main surface,
   the first and second electrode sections being electrically connected,
   said semiconductor device, further comprising a stacked substrate on which the semiconductor chip is stacked,
   the stacked substrate including: a plurality of external connection terminals; and a plurality of conductive sections being connected to the external connecting terminals, respectively, and
   at least one of the conductive sections being connected to said at least one first electrode section via at least one wire.

3. The semiconductor device according to claim 2, wherein:
   the semiconductor chip is fixed to one surface of the stacked substrate,
   at least one of the external connection terminals is disposed in a region of another surface of the stacked substrate, the region overlapping the semiconductor chip when viewed from a direction normal to the surface of the substrate, and
   said at least one of the conductive sections, connected to said at least one external connection terminals disposed in the region, connects said at least one external connection terminals and said at least one wire via one of through holes provided in the stacked substrate.

4. The semiconductor device according to claim 2, wherein the semiconductor chip, said at least one wire, and said at least one conductive section are sealed with an insulating material.

* * * * *